(12) United States Patent
Hooper et al.

(10) Patent No.: US 7,276,391 B2
(45) Date of Patent: Oct. 2, 2007

(54) MANUFACTURE OF A SEMICONDUCTOR DEVICE

(75) Inventors: Stewart Hooper, Oxfordshire (GB); Valerie Bousquet, Oxford (GB); Katherine L. Johnson, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 287 days.

(21) Appl. No.: 10/974,226

(22) Filed: Oct. 27, 2004

(65) Prior Publication Data

US 2005/0170537 A1 Aug. 4, 2005

(30) Foreign Application Priority Data

Oct. 28, 2003 (GB) ................... 0325099.0

(51) Int. Cl.
*H01L 21/477* (2006.01)
(52) U.S. Cl. .............. 438/47; 438/46; 257/14; 257/94; 257/E33.028
(58) Field of Classification Search .............. 438/46, 438/47, 22; 257/E33.028, 14, 94
See application file for complete search history.

(56) References Cited

U.S. PATENT DOCUMENTS

| 4,400,256 | A | 8/1983 | Riley |
| 5,777,350 | A | 7/1998 | Nakamura et al. |
| 6,537,513 | B1 | 3/2003 | Amano et al. |
| 2002/0048836 | A1* | 4/2002 | Kano et al. ................... 438/46 |
| 2003/0138976 | A1 | 7/2003 | Sugawara |
| 2003/0143770 | A1 | 7/2003 | Takeya |

FOREIGN PATENT DOCUMENTS

| GB | 0325100.6 | 10/2003 |
| JP | 2002-043618 | 2/2002 |

* cited by examiner

*Primary Examiner*—Matthew C. Landau
(74) *Attorney, Agent, or Firm*—Renner, Otto, Boisselle & Sklar, LLP

(57) ABSTRACT

A method of fabricating the active region of a semiconductor light-emitting device, in which the active region comprises a plurality of barrier layers (11,13,15,17) with each pair of barrier layers being separated by a quantum well layer (12,14,16), comprises annealing each barrier layer (11,13, 15,17) separately. Each barrier layer (11,13,15,17) is annealed once it has been grown, and before a layer is grown over the barrier layer. A device grown by the method of the invention has a significantly higher optical power output than a device made by a convention fabrication process having a single annealing step.

16 Claims, 4 Drawing Sheets

MANUFACTURE OF A SEMICONDUCTOR DEVICE

FIELD OF THE INVENTION

The present invention relates to manufacture of a semiconductor device and, in particular, to manufacture of the active region of a semiconductor light-emitting device. It may be applied to, for example, the manufacture of light-emitting devices in a nitride material system such as, for example, the (Al,Ga,In)N material system.

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminum, gallium and indium will be referred to as AlGaInN, a member that has a zero aluminum mole fraction but that has non-zero mole fractions of gallium and indium will be referred to as InGaN, a member that has a zero indium mole fraction but that has non-zero mole fractions of gallium and aluminum will be referred to as AlGaN, and so on. There is currently considerable interest in fabricating semiconductor light-emitting devices in the (Al,Ga,In)N material system since devices fabricated in this system can emit light in the blue wavelength range of the spectrum. Semiconductor light-emitting devices fabricated in the (Al,Ga,In)N material system are described in, for example, U.S. Pat. No. 5,777,350.

FIG. 1 is a schematic view of a semiconductor laser device or laser diode (ID) fabricated in the (Al,Ga,In)N material system. The device is able to emit light in the blue wavelength range, in the 380 nm to 450 nm wavelength range.

The laser diode 18 of FIG. 1 is grown over a substrate 1. In the laser diode 18 of FIG. 1 the substrate 1 is a template substrate consisting of an n-type doped GaN layer 3 grown over a sapphire base substrate 2. A buffer layer 4, a first cladding layer 5 and a first optical guiding layer are grown, in this order, over the substrate 1. In the embodiment of FIG. 1 the buffer layer 4 is a n-type GaN layer, the first cladding layer 5 is an n-type AlGaN layer, and the first optical guiding layer is an n-type GaN layer.

An active region 7 is grown over the first optical guiding layer 6.

A second optical guiding layer 8, a second cladding layer 9 and a cap layer 10 are grown, in this order, over the active region 7. The second optical guiding layer 8 and second cladding layer 9 have opposite conductivity type to the first optical guiding layer 6 and first cladding layer 5. In the laser diode 18 of FIG. 1 the second optical guiding layer 8 is a p-type GaN layer, the second cladding layer 9 is a p-type AlGaN layer, and the cap layer 10 is a p-type GaN layer.

The active region 7 of the laser device 18 shown in FIG. 1 is a multiple quantum well (MQW) active region, and contains a plurality of quantum well layers 12,14,16. Each quantum well layer 12,14,16 is sandwiched between two barrier layers 11,13,15,17. In the laser device 18 of FIG. 1, the lowermost barrier layer 11 and the uppermost barrier layer 17 are AlGaN layers. The intermediate barrier layers 13,15 may be, for example, layers of $In_xGa_{1-x}N$ ($0 \leq x \leq 0.05$), $Al_xGa_{1-x}N$ ($0 \leq x \leq 0.4$) or AlGaInN. The quantum well layers 12,14,16 may be, for example, layers of $In_xGa_{1-x}N$ ($0 \leq x \leq 0.3$), $Al_xGa_{1-x}N$ ($0 \leq x \leq 0.1$) or AlGaInN.

FIG. 1 shows a laser device having an MQW active region. A laser fabricated in the (Al,Ga,In)N system may alternatively have a single quantum well (SQW) active region that contains a single quantum well layer. In such a laser, the upper AlGaN barrier layer 17 would be grown directly on the first quantum well layer 12. The second and third quantum well layers 14,16 and the intermediate barrier layers 13,15 would be omitted.

Where the laser device 18 has a MQW active region, the active region is not limited to three quantum well layers as shown in FIG. 1. An MQW active region may have two quantum well layers or it may have three or more quantum well layers.

The structure of the laser 18 of FIG. 1 is described in more detail in co-pending UK patent application No. 0325100.6, having the same filing date as the present application.

ACKNOWLEDGEMENT OF THE PRIOR ART

U.S. Pat. Nos. 4,400,256 and 6,537,513, U.S. Pat. application Ser. Nos. 2003/0138976 and 2003/0143770, and Japanese patent application 2002-043 618 disclose methods of fabrication of semiconductor laser structures.

SUMMARY OF THE INVENTION

A first aspect of the present invention provides a method of fabricating the active region of a semiconductor light-emitting device in a nitride materials system, the method comprising the steps of, in sequence: a) growing a first barrier layer, b) annealing the first barrier layer at a temperature greater than the growth temperature of step (a); c) growing a first quantum well layer over the first barrier layer, d) growing a second barrier layer over the first quantum well layer, and e) annealing the second barrier layer at a temperature greater than the growth temperature of step (d).

Annealing each barrier layer after it is grown, before deposition of the next layer, has been found to increase the power output of the laser device.

The method may comprise the further steps of, in sequence: f) growing a second quantum well layer over the second barrier layer, g) growing a third barrier layer over the second quantum well layer, and h) annealing the third barrier layer at a temperature greater than the growth temperature of step (g). Steps (f) to (h) may be repeated as necessary to grow an MQW active region having any number of quantum well layers.

The invention may be applied to devices having an SQW active region or to devices having an MQW active region. Where the invention is applied to a device having an MQW active region it is preferable that each barrier layer of the active region is annealed after it is grown, at a temperature greater than its deposition temperature, before deposition of the next layer.

Each annealing step may comprise annealing the respective barrier layer at a temperature at least 50° C. greater than the growth temperature of the layer.

Each barrier layer may be a layer of $Al_xGa_{1-x}N$ (where $0 \leq x \leq 0.4$), $In_xGa_{1-x}N$ ($0 \leq x \leq 0.05$) or AlGaInN.

The growth temperature of each barrier layer may be at least 500° C. and it may be less than 1050° C.

The annealing temperature of each barrier layer may be at least 700° C., and it may be at least 850° C.

The annealing temperature of each barrier layer may be less than 1100° C., and it may be less than 1000° C.

The growth temperature of each quantum well layer may be at least 500° C. and it may be less than 850° C.

The or each quantum well layer may comprises a layer of $In_xGa_{1-x}N$ ($0 \leq x \leq 0.3$), $Al_xGa_{1-x}N$ ($0 \leq x \leq 0.1$) or AlGaInN.

The device may be a light-emitting diode, or it may be a laser device.

A second aspect of the invention provides a semiconductor light-emitting device manufactured by a method of the first aspect of the invention.

BRIEF DESCRIPTION OF THE DRAWINGS

Preferred features of the present invention will now be described by way of illustrative example with reference to the accompanying figures in which.

Like references denote like components throughout the drawings.

DETAILED DESCRIPTION OF THE PREFERRED EMBODIMENTS

A fabrication method of the invention will now be described with reference to fabrication of a laser device having the structure shown in FIG. 1. The fabrication method will be described with reference to an MBE (molecular beam epitaxy) growth process, although other growth techniques can be used. The invention will be described with reference to fabrication of a laser device in the (Al,Ga,In)N materials system.

Initially, a suitable substrate is cleaned and prepared. In the method of FIGS. 2 to 5 a template substrate 1 consisting of an n-type doped GaN epitaxial layer 3 grown over a sapphire base 2 is used, but the method is not limited to use with this particular substrate. The cleaned and prepared substrate is then introduced into the growth chamber of an MBE growth apparatus.

Figure 2:
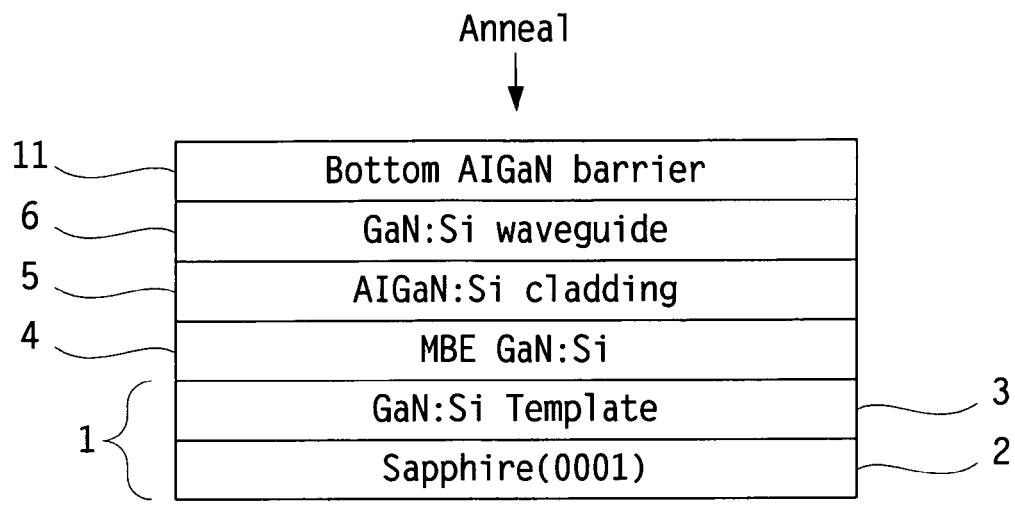
FIG. 2 to 5 illustrate a fabrication method of the present invention.

Semiconductor layers that include at least a barrier layer 11 disposed over a first cladding layer 5 are then grown over the substrate 1 in a first growth step. In this embodiment, a buffer layer 4, a first cladding layer 5 and a first optical guiding layer 6 are grown, in this order, over the substrate 1 although the invention is not limited to this specific layer structure. A first barrier layer 11 then is grown on the first optical guiding layer 6. The structure obtained by the first growth step is shown in FIG. 2.

The deposition of material is then stopped, and the temperature in the growth chamber is increased so as to anneal the first barrier layer 11 at an annealing temperature that is greater than the growth temperature of the first barrier layer. The growth temperature in an MBE apparatus may for example be determined by a heated susceptor on which the substrate 1 is mounted, and the substrate temperature is varied by varying the susceptor temperature. Alternatively, the substrate may be directly heated by radiation from a heater element provided in the growth chamber, and the substrate temperature can be varied by increasing or decreasing the output of the heater.

The duration of the annealing step will depend on the annealing temperature. If a low annealing temperature is used the duration of the annealing step will in general be relatively long, whereas if a high annealing temperature is used the duration of the annealing step may be relatively short. The annealing temperature of a barrier layer should be at least 50° C. greater than the growth temperature of that layer although, in practice, best results are obtained using an annealing temperature that is 200° C. or more higher than the growth temperature of the barrier layer. In the case of a barrier layer grown at a growth temperature of 600° C., good results were obtained by annealing the layer at an annealing temperature of approximately 900° C. for 20 seconds.

It should be noted that the rate at which the substrate temperature is increased to a desired annealing temperature and the rate at which the substrate temperature is reduced after an annealing step should be kept sufficiently low to avoid inducing significant thermal stresses in the substrate or in the layers grown over the substrate. A temperature ramp rate of no more than 40° C./minute has been found to be suitable. Thus, even though the annealing step in the example given above has a duration of 20 seconds, it will take approximately 10 minutes to increase the substrate temperature from the growth temperature of 600° C. to the annealing temperature of 900° C., and approximately a further 10 minutes after the annealing step to reduce the substrate temperature to a suitable temperature for the growth of the next layer.

Figure 3:
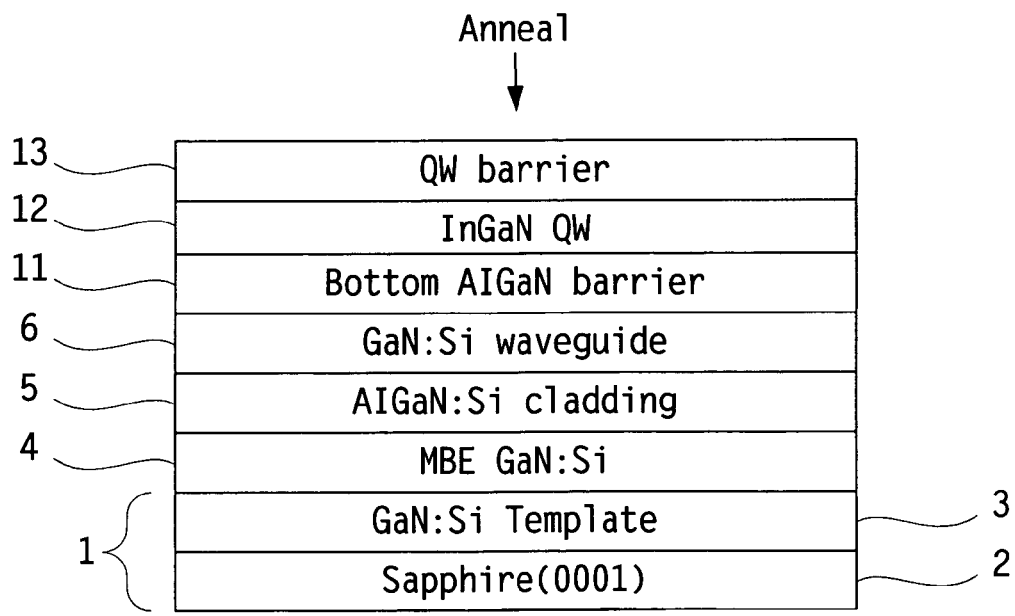

Once the first barrier layer 11 has been annealed, the deposition of material is resumed. In a second growth step a first quantum well layer 12 is grown on the first barrier layer 11 after which another barrier layer 13 is grown on the first quantum well layer. The barrier layer 13 will be referred to as an "intermediate" barrier layer since in the complete structure it is disposed between two quantum well layers, as will be described below. The structure obtained by the second growth step is shown in FIG. 3. In general, after the first barrier layer 11 has been annealed the temperature of the growth chamber will be reduced before the first quantum well layer 12 is grown.

The deposition of material is then stopped, and the temperature in the growth chamber is increased so as to anneal the intermediate barrier layer 13 at an annealing temperature that is greater than its growth temperature. The temperature and duration of this annealing step correspond to those described above for the step of annealing the lower AlGaN barrier layer 11.

Figure 4:
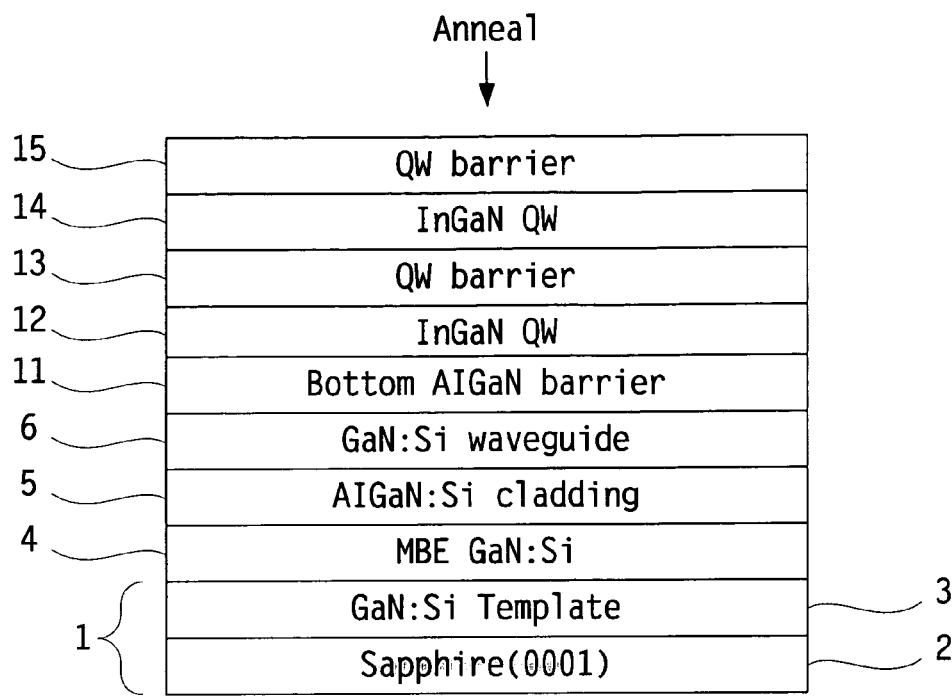

Once the intermediate barrier layer 13 has been annealed, the deposition of material is resumed. In a third growth step a second quantum well layer 14 is grown on the intermediate barrier layer 13 after which a further intermediate barrier layer 15 is grown on the second quantum well layer. The structure obtained by the third growth step is shown in FIG. 4. In general, after the intermediate barrier layer 13 has been annealed the temperature of the growth chamber will be reduced before the first quantum well layer 12 is grown.

The deposition of material is then stopped, and the temperature in the growth chamber is increased so as to anneal the intermediate barrier layer 15 at an annealing temperature that is greater than its growth temperature. The temperature and duration of this annealing step correspond to those described above for the step of annealing the lower AlGaN barrier layer 11.

Figure 5:
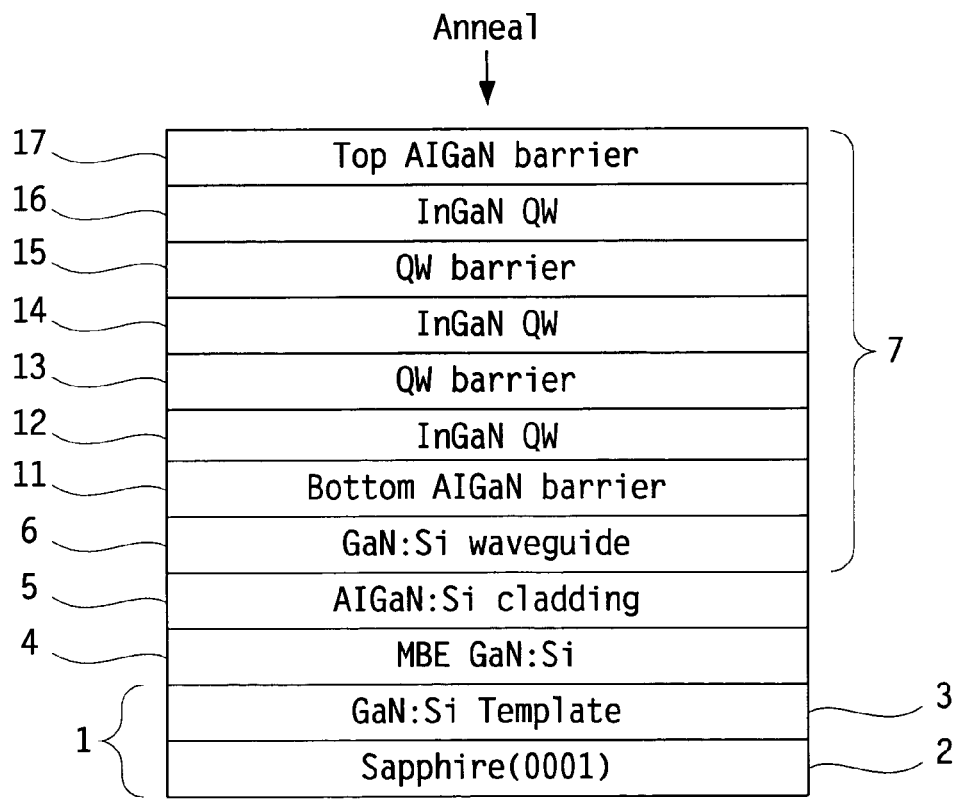

Once the intermediate barrier layer 15 has been annealed, the deposition of material is resumed. In a fourth growth step a third quantum well layer 16 is grown on the barrier layer 15. A final barrier layer 17 is then grown on the third quantum well layer 16, to complete the active region 7. The structure obtained by the fourth growth step is shown in FIG. 5. In general, after the intermediate barrier layer 15 has been annealed the temperature of the growth chamber will be reduced before the third quantum well layer 12 is grown.

The deposition of material is then stopped, and the temperature in the growth chamber is increased so as to anneal the final barrier layer 17 at an annealing temperature that is greater than its growth temperature. The temperature and duration of this annealing step correspond to those described above for the step of annealing the lower AlGaN barrier layer 11.

Finally, the deposition of material is again resumed. A second optical guiding region 8, a second cladding region 9, and a cap layer 10 are grown, in this order, over the final barrier layer 17 to provide the laser structure shown in FIG. 1. In general, after the final barrier layer 17 has been annealed the temperature of the growth chamber will be reduced before the second optical guiding region 8 is grown.

Figure 1:
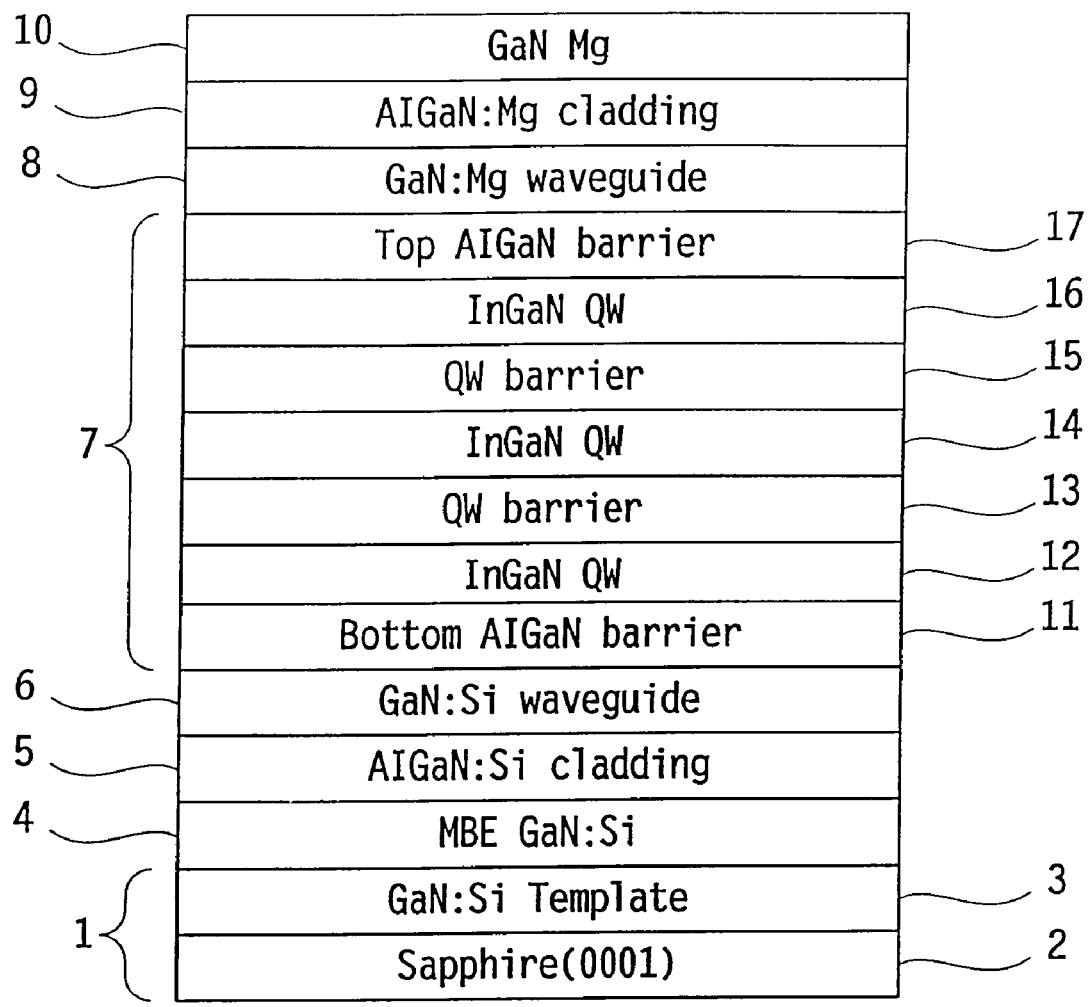
FIG. 1 is a schematic sectional view of a semiconductor laser device fabricated in the (Al,Ga,In)N system.

The invention is not limited to growth of the specific device structure shown in FIG. 1. It may applied to, for example, the growth of a laser device having a SQW active region. To grow a laser device having an SQW active region, the layer structure shown in FIG. 2 would be grown, and the first barrier layer 11 would be annealed at a temperature greater than its growth temperature. After the annealing step a quantum well layer and the final barrier layer 17 would be grown over the first barrier layer, and the final barrier layer annealed at a temperature greater than its growth temperature. The second optical guiding region, second cladding region and cap layer would then be grown over the final barrier layer.

The invention may also be applied to the growth of a laser device having an MQW active region with any desired number of quantum well layers. To grow a laser device having only two quantum well layers, the third growth step would be omitted so that the second quantum well layer 14 and the barrier layer 15 were not present. To grow a laser device having an MQW active region with more than three quantum well layers, one additional growth step corresponding to the third growth step would be carried out for each desired additional quantum well layer (before growth of the final barrier layer 17). Each barrier layer would be annealed in a separate annealing step, before a further layer were grown over the barrier layer.

The invention is not limited to manufacture of a laser device. It may be used in the manufacture of other types of devices such as, for example, a light-emitting diode. The active region of an LED has the same general structure as the active regions of the laser devices described above, and may be an SQW active region or an MQW active region. Fabrication of an LED rather than a laser device essentially requires that the active region is incorporated in an LED structure rather than in a laser structure.

Figure 6:
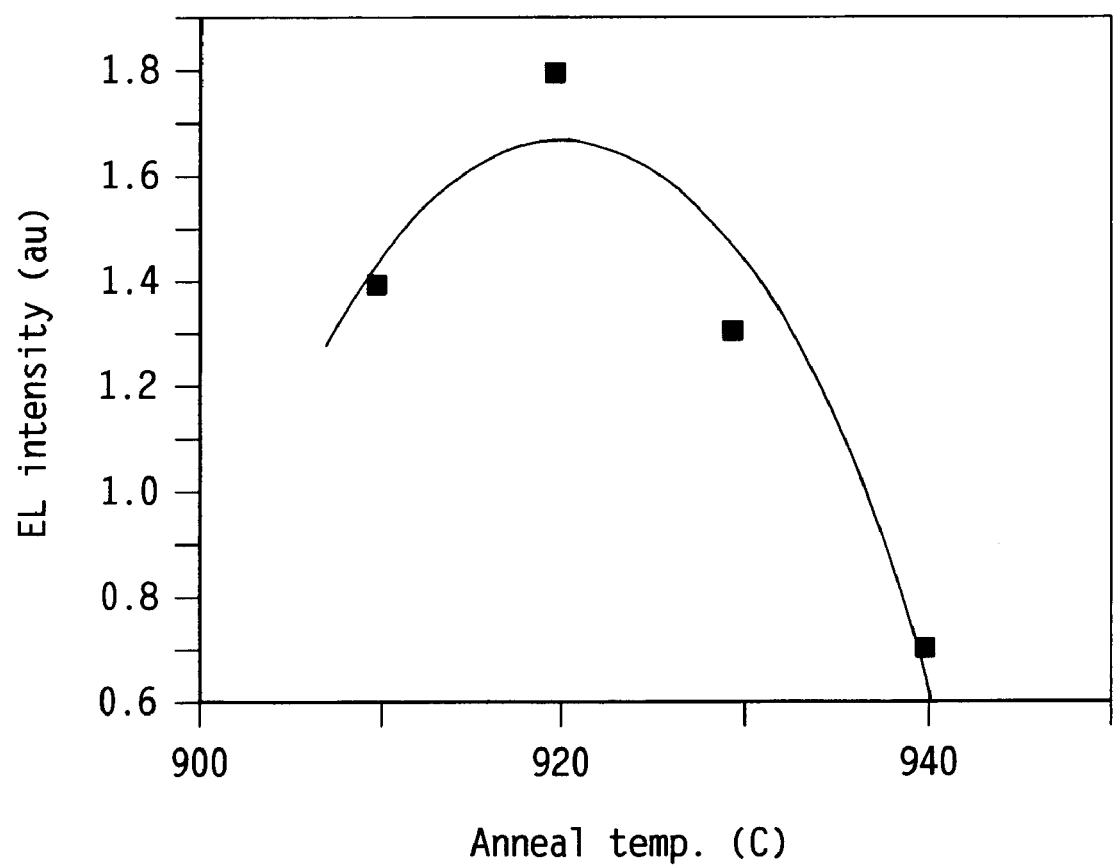
FIG. 6 illustrates the electroluminescence intensity of a light-emitting diode (LED) manufactured by a method of the present invention.

The effect of individually annealing each barrier layer 11,13,15,17, at a greater temperature that its growth temperature, before the next layer is deposited on the barrier layer, has been found to increase the optical output power of the device. FIG. 6 shows the electroluminescence intensity, in arbitrary units, of a semiconductor light-emitting diode manufactured by a method of the present invention. FIG. 6 shows the power output from an LED having a multiple quantum well active region with the general structure shown in FIG. 1, although the LED did not include the first and second cladding layers 4, 9 or the first and second optical guiding layer 5,8 of FIG. 1. All barrier layers of the active region were annealed separately, immediately after being grown. The lower AlGaN barrier layer 11 was annealed at a temperature of 890° C. for 20 seconds, and the upper AlGaN barrier layer 17 was annealed at 970° C. for 20 seconds. (In fabrication of a complete device a layer of p-doped GaN or AlGaN is deposited directly on the upper barrier layer 17, and the structure is therefore heated to a suitable temperature for deposition of good quality GaN or AlGaN once the upper barrier layer 17 has been grown. A suitable deposition temperature for p-doped GaN or AlGaN is around 970° C., and it is therefore difficult to avoid annealing the upper barrier layer 17 at this temperature.) Each intermediate barrier layer 13,15 etc was a GaN barrier layer and was annealed for 20 seconds; the temperature at which the intermediate barrier layers were annealed is shown on the horizontal axis of FIG. 6—all intermediate barrier layers were annealed at the same temperature.

The output optical intensity of an LED having an active region fabricated in a conventional manner, in which all barrier layers were annealed in single annealing step, would be expected to be less than 0.1 on the intensity scale of FIG. 6. It can therefore be seen that a fabrication method of the invention produces a device that has a substantially greater output power than devices made by conventional fabrication methods. It is possible that annealing each barrier layer separately, before a further layer is grown over the barrier layer, is more effective at removing crystal defects and dislocations in the barrier layers than the conventional process of using a single annealing step once all barrier layers have been grown.

It will be seen that a maximum intensity is obtained at an annealing temperature for the intermediate barrier layers of approximately 920° C. However, annealing the intermediate barrier layers at a temperature in the range of from approximately 850° C. to approximately 1000° C. produced a device that had a significantly greater optical power output than a device made by a conventional fabrication method.

In the laser device grown in the method of FIG. 2 to 5, the buffer layer 4 is a n-type GaN layer, the first cladding layer 5 is an n-type AlGaN layer, and the first optical guiding layer is an n-type GaN layer. The first barrier layer 11 and the upper barrier layer 17 (that is, the last barrier layer formed in the growth process) may be layers of $Al_xGa_{1-x}N$ with $0 \leq x \leq 0.4$, layers of $In_xGa_{1-x}N$ ($0 \leq x \leq 0.05$) or layers of AlGaInN. If AlGaInN is used for the barrier layers a suitable composition is $Al_xIn_yGa_{1-(x+y)}N$ where $0 \leq x \leq 0.4$ and $0 \leq y \leq 0.05$. The intermediate barrier layers may be, for example, layers of $In_xGa_{1-x}N$ ($0 \leq x \leq 0.05$), $Al_xGa_{1-x}N$ ($0 \leq x \leq 0.4$) or AlGaInN. The quantum well layers 12,14,16 in this embodiment are layers of $In_xGa_{1-x}N$ ($0 \leq x \leq 0.3$), but could alternatively be layers of $Al_xGa_{1-x}N$ ($0 \leq x \leq 0.1$) or AlGaInN. If AlGaInN is used for the quantum well layers a suitable composition is $Al_xIn_yGa_{1-(x+y)}N$ where $0 \leq x \leq 0.1$ and $0 \leq y \leq 0.3$.

The second optical guiding layer 8 and second cladding layer 9 have opposite conductivity type to the first optical guiding layer 6 and first cladding layer 5. In the embodiment of FIGS. 2 to 5 the second optical guiding layer 8 is a p-type GaN layer, the second cladding layer 9 is a p-type AlGaN layer, and the cap layer 10 is a p-type GaN layer.

Suitable growth temperatures for the barrier layers are in the range from 500° C. to 1050° C. 500° C. is the lower temperature limit for MBE growth of AlGaN, and barrier layers grown at a lower temperature are unlikely to have good material quality. 1050° C. is the approximate upper temperature limit for MOCVD growth of AlGaN. Thus, use of a growth temperature within the range from approximately 500° C. to approximately 1050° C. should provide good material quality regardless of the growth technique used.

Suitable growth temperatures for the quantum well layers are in the range from 500° C. to 850° C. 500° C. is the lower temperature limit for MBE growth of InGaN, and barrier layers grown at a lower temperature are unlikely to have good material quality. 850° C. is the approximate upper temperature limit for growth of InGaN, owing to the difficulty of incorporating indium into the material at temperatures significantly greater than 850° C. Thus, use of a growth temperature within the range from approximately 500° C. to approximately 850° C. should provide good material quality regardless of the growth technique used.

The quantum well layers and barrier layers do not need to be grown at the same growth temperature. A quantum well layer could be grown at a temperature of, for example, 650° C. and the growth temperature could be changed, for example increased to 850° C., for growth of a barrier layer on the quantum well layer. Alternatively, one growth temperature could be used for both the quantum well layers and for the barrier layers.

Suitable annealing temperatures for the barrier layers are in the range from 700° C. to 1100° C. As noted above, the barrier layers are preferably annealed at a temperature within the range from approximately 850° C. to 1000° C. since such annealing temperatures provide a significant increase in the power output of the resultant device. Annealing temperatures of around 900° C., for example in the range from approximately 900° C. to approximately 950° C., give particularly good results, in that the power output of the resultant device has a maximum for annealing temperatures in this range.

The invention has been described above with reference to MBE growth. Where the invention is implemented using MBE growth, the growth techniques described in UK patent application No. 0219728.3 may be employed.

The invention is not, however limited to use with MBE growth but may be applied with other growth techniques such as, for example, metal-organic chemical vapor deposition (MOCVD).

The invention has been described with reference to fabrication of a device in the (Al,Ga,In)N materials system. The invention is not, however, limited to this particular materials system, but it may be applied to other nitride material systems.

The invention claimed is

1. A method of fabricating the active region of a semiconductor light-emitting device in a nitride material system, the method comprising, in order, the steps of:
    a) growing a first barrier layer;
    b) annealing the first barrier layer at a temperature greater than the growth temperature of step (a);
    c) growing a first quantum well layer over the first barrier layer;
    d) growing a second barrier layer over the first quantum well layer; and
    e) annealing the second barrier layer at a temperature greater than the growth temperature of step (d).

2. A method as claimed in claim 1 and comprising the further steps of:
    f) growing a second quantum well layer over the second barrier layer,
    g) growing a third barrier layer over the second quantum well layer, and
    h) annealing the third barrier layer at a temperature greater than the growth temperature of step (g).

3. A method as claimed in claim 1 wherein each annealing step comprises annealing the respective barrier layer at a temperature at least 50° C. greater than the growth temperature of the layer.

4. A method as claimed in claim 2 wherein each annealing step comprises annealing the respective barrier layer at a temperature at least 50° C. greater than the growth temperature of the layer.

5. A method as claimed in claim 1 wherein each barrier layer is a layer of $Al_xGa_{1-x}N$ ($0 \leq x \leq 0.4$), $In_xGa_{1-x}N$ ($0 \leq x \leq 0.05$) or AlGaInN.

6. A method as claimed in claim 1 wherein the growth temperature of each barrier layer is at least 500° C.

7. A method as claimed in claim 1 wherein the growth temperature of each barrier layer is less than 1050° C.

8. A method as claimed in claim 1 wherein the annealing temperature of each barrier layer is at least 700° C.

9. A method as claimed in claim 1 wherein the annealing temperature of each barrier layer is at least 850° C.

10. A method as claimed in claim 1 wherein the annealing temperature of each barrier layer is less than 1100° C.

11. A method as claimed in claim 1 wherein the annealing temperature of each barrier layer is less than 1000° C.

12. A method as claimed in claim 1 wherein the growth temperature of the quantum well layer is at least 500° C.

13. A method as claimed in claim 1 wherein the growth temperature of the quantum well layer is less than 850° C.

14. A method as claimed in claim 1 wherein the quantum well layer comprises a layer of $In_xGa_{1-x}N$ ($0 \leq x \leq 0.3$), $Al_xGa_{1-x}N$ ($0 \leq x \leq 0.1$) or AlGaInN.

15. A method as claimed in claim 1 wherein the device is a light-emitting diode.

16. A method as claimed in claim 1 wherein the device is a laser device.

* * * * *